United States Patent
Dautartas et al.

[11] Patent Number: 6,074,934
[45] Date of Patent: Jun. 13, 2000

[54] APPARATUS FOR CLEAVING LASER BARS

[75] Inventors: Mindaugas Fernand Dautartas, Alburtis; Joseph Michael Freund, Fogelsville; William Andrew Gault, Mohnton; John Michael Geary, Macungie; George John Przybylek, Douglasville; Dennis Mark Romero, Allentown, all of Pa.

[73] Assignee: Lucent Technologies Inc., Murray Hill, N.J.

[21] Appl. No.: 09/196,956

[22] Filed: Nov. 20, 1998

[51] Int. Cl.⁷ .................................................... H01L 21/46
[52] U.S. Cl. .......................... 438/462; 438/460; 438/461
[58] Field of Search .................................... 438/460, 461, 438/462; 65/112; 83/880, 881, 32

[56] References Cited

U.S. PATENT DOCUMENTS

| | | | |
|---|---|---|---|
| 3,953,919 | 5/1976 | Moore | 29/583 |
| 4,469,500 | 9/1984 | Miller | 65/112 |
| 4,590,667 | 5/1986 | Simon | 29/589 |
| 5,128,282 | 7/1992 | Ormond et al. | 437/226 |
| 5,171,717 | 12/1992 | Broom et al. | 437/226 |
| 5,174,188 | 12/1992 | Petroz | 83/882 |
| 5,314,844 | 5/1994 | Imamura | 437/226 |
| 5,393,707 | 2/1995 | Canning | 437/226 |
| 5,418,190 | 5/1995 | Cholewa et al. | 437/226 |
| 5,904,548 | 5/1999 | Orcutt | 438/462 |
| 6,017,804 | 1/2000 | Fruend et al. | 438/460 |

*Primary Examiner*—Charles Bowers
*Assistant Examiner*—Laura M Schillinger
*Attorney, Agent, or Firm*—Darby & Darby

[57] ABSTRACT

A method and apparatus are provided for automated cleaving of semiconductor laser bars into laser devices. The structures to be cleaved are sandwiched between two sheets of plastic film and, while supported on a stabilizing surface, are transported between the sheets in a direction perpendicular to scribe marks defining the sides of the laser devices. At one point, the film sheets with the structures between them pass over a raised breaker assembly on the stabilizing surface. A high pressure air source above the breaker assembly provides a blast of air towards each film sheet enclosed structure as it passes over the breaker assembly. This causes the structure to fracture or cleave along the scribe line. As the film sheet pass over the breaker assembly, the structure is cleaved at each successive scribe line. Thus, downstream of the breaker assembly, there are provided a series of separated devices between the two film sheets. Moreover, there is no possibility that the devices will be displaced as a result of any air currents, since they are securely retained between the two film sheets.

13 Claims, 1 Drawing Sheet

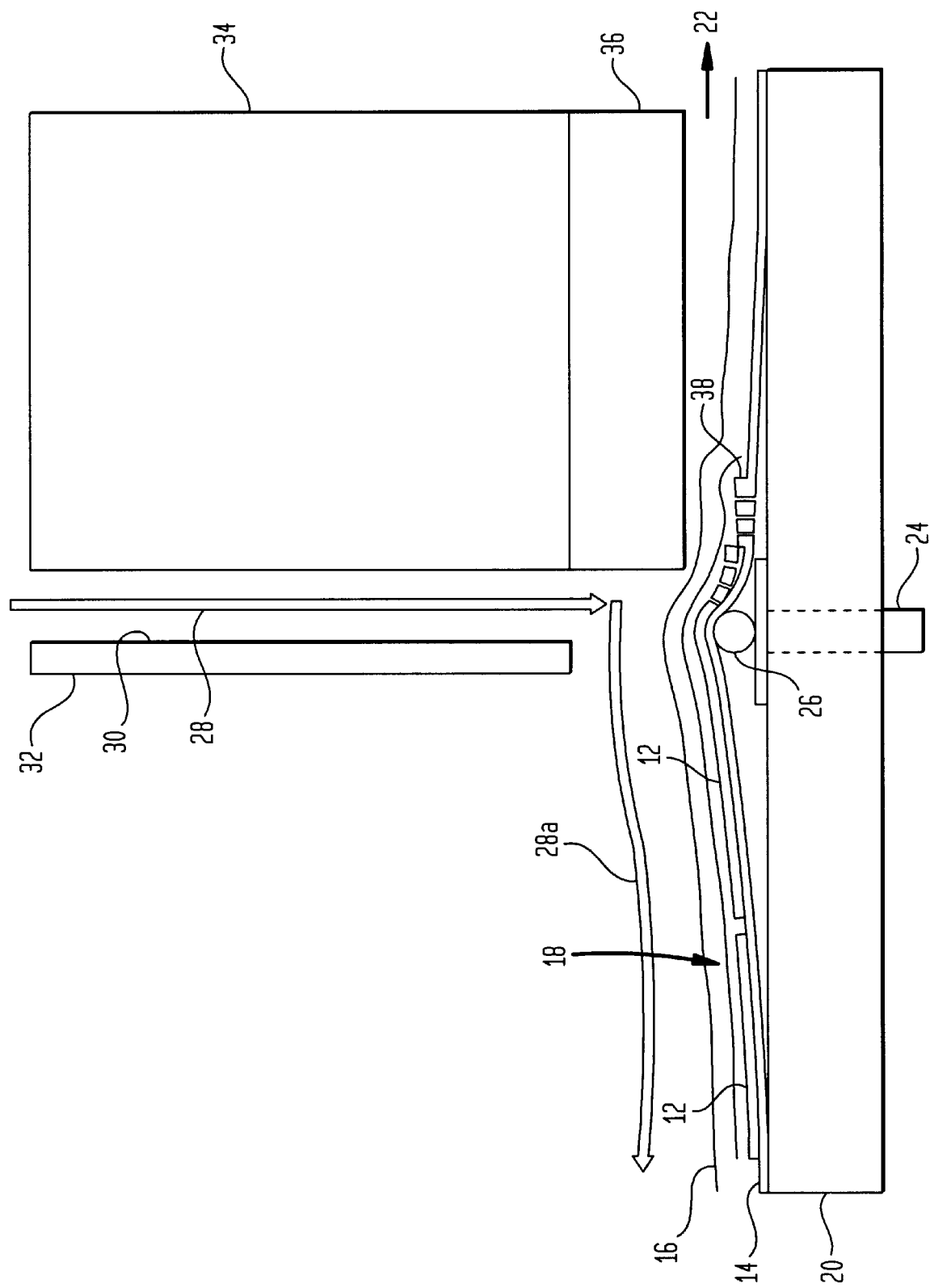

APPARATUS FOR CLEAVING LASER BARS

FIELD OF THE INVENTION

The present invention relates generally to the manufacture of integrated circuit laser devices and, more particularly, concerns a method and apparatus for cleaving integrated circuit structures, such as laser bars into substructures, such as individual laser chips.

BACKGROUND OF THE INVENTION

Integrated circuit laser devices are manufactured on wafers which are two inches in diameter and about 12–20 mils thick. After initial manufacture, the wafers are thinned to about 3.5–4.5 mils and separated into smaller units, called sections, with four sections being derived from a single wafer. The sections are trimmed in one dimension, which we will call length, to be about 0.4 inches long. They are also scored across their widths to form 20–30 subdivisions, called bars, which are about 12 mils wide and about 0.4 inches long. During subsequent processing, the sections are divided into bars by breaking or cleaving them along the scribe lines, to form facets along their elongated sides. Each bar is then scribed across its width to form about forty subdivisions, and the bars are cleaved along these score lines to form the individual chips.

Patent application No. 09/004,939, owned by the assignee of the present patent application, discloses a method and apparatus for automated cleaving of laser bars into chips. The bars to be cleaved are sandwiched between two sheets of plastic film in lengthwise, side-by-side arrangement, and are transported between the sheets in a direction perpendicular to the scribe marks defining the sides of the laser chips. At one point, the film sheets with the bars between them pass over a raised breaker assembly. A high pressure air source above the breaker assembly provides a blast of air towards the film sheet enclosed laser bars as they pass over the breaker assembly. This causes the laser bars to fracture or cleave along a scribe line. As the film sheet pass over the breaker assembly, the laser bars are cleaved at each successive scribe line. Thus, downstream of the breaker assembly, there are provided a series of separated chips between the two film sheets.

Although the system of application 09/ achieved an improvement over existing methods of cleaving laser bars and was capable of cleaving several bars simultaneously, it still required the cleaving process to be stopped in order to load each new group of bars to be cleaved.

In accordance with one aspect of a presently preferred embodiment demonstrating objects and features of the present invention, there is provided a method and apparatus for continuous, automated cleaving of a continuous stream of laser bars into chips. The bars to be cleaved are sandwiched between two elongated sheets of plastic film, are arranged in lengthwise alignment along the length of the sheets, and are transported between the sheets in a direction perpendicular to the scribe marks defining the sides of the laser chips, while being supported by a stabilizing surface. At one point, the film sheets with the bars between them pass over a raised breaker assembly on the stabilizing surface. A high pressure air source above the breaker assembly provides a blast of air towards each film sheet enclosed laser bar as it passes over the breaker assembly. This causes the laser bar to fracture or cleave along a scribe line. As the film sheet pass over the breaker assembly, each laser bar is cleaved at each successive scribe line. Thus, downstream of the breaker assembly, there is provided a continuous stream of separated chips between the two film sheets.

One of the reasons for placing the laser bars between the plastic sheets in the system of application No. 09/ was to prevent the bars and separated chips from being blown away by the air stream. However, the air stream causes the top film sheet to vibrate and, in the process, causes the separated chips to imbedded in or adhered to the top sheet.

In accordance with another aspect of a presently preferred embodiment demonstrating objects and features of the present invention, a downwardly projecting air curtain is placed above the top film sheet in close proximity thereto, in order to prevent airflow over the sheet generally parallel to its surface which tends to produce a venturi effect that causes lifting and dropping (vibration) of the sheet.

In accordance with a further aspect of a presently preferred embodiment demonstrating objects and features of the present invention, a sheet of thin, cling-free material, such as onion paper, is provided between one of the sheets of plastic film and the laser bars to prevent adhesion of the bars and separated chips to the plastic film.

BRIEF DESCRIPTION OF THE DRAWING

The foregoing brief description, as well as other objects, features and advantages of the present invention will be understood more completely from the following detailed description of a presently preferred, but nonetheless embodiment in accordance with the invention, with reference being had to the accompanying drawing, in which the sole FIGURE is a side view, with parts shown in section, illustrating an apparatus for cleaving laser bars into individual devices in accordance with the present invention.

DETAILED DESCRIPTION OF THE PREFERRED EMBODIMENT

Turning now to the drawing, there is illustrated a side view of an apparatus for cleaving laser bars 12 into individual laser chips or devices 38. The laser bars 12 are provided between elongated film sheets 14 and 16, preferably made of a plastic material. Between the laser bars 12 and the top sheet 16, there is provided a sheet of onion paper 18, which prevents the bars 12 and resulting devices from sticking to the top sheet 16. The sheets 14, 16 are supported on a stabilizing surface 20, which serves to minimize vibration of the film sheets. The film sheets 14, 16 and what is enclosed between them move in the direction of arrow 22. The stabilizing surface 20 maybe stationary or may move with the sheets 14, 16. However, in the preferred embodiment, the stabilizing surface 20 is stationary. It will be appreciated that, by providing a series of lengthwise aligned bars 12 between sheets 14, 16 and supporting them on surface 20, it is possible to perform cleaving continuously.

On the stabilizing surface 20, there is mounted a breaker assembly 24. In the disclosed embodiment, the breaker assembly 24 is fixedly mounted to the stabilizing surface 20. However, should a system be configured in which the stabilizing surface 20 moves with the film sheets 14, 16, alternate support would need to be provided to retain the breaker assembly in a fixed position. At the top of the breaker assembly 24, there is provided a substantially cylindrical breaker bar 26, over which the sheets 14, 16 and their enclosed contents pass. Above the breaker bar 26, there is provided a high pressure gas source (not shown), which directs a high pressure jet or stream 28 of a gas, preferably air at a pressure of 30–40 psi, towards the breaker bar 26. The air jet 28 flows in a passageway 30 formed between walls 32 and 34. At the bottom of wall 34, there is provided a downwardly extending air curtain 36, which extends as closely as possible to sheet 16 without touching it, and which prevents the air stream 28 from passing to the light in the drawing. Substantially the entire air current therefore passes below wall 32 and out to the left. In a preferred embodiment, air curtain 36 is sheet of the hook component of a hook-and-pile fastener assembly which is commercially available under the trademark VELCRO.

From the drawing, it will be appreciated that the leading edge of each laser bar 12 will pass over and extend beyond the breaker bar 26 before being exposed to the downward air stream 28. The air stream therefore provides a downward force which tends to cleave the bar at the scribe line closest to the breaker bar. The cleaved devices 38 extend off to the right in the drawing and, being transported between sheets 14, 16, will not fly away or be otherwise disturbed by air currents.

As explained above, air curtain 36 prevents air current 28 from flowing to the right. In the absence of the air curtain, air flowing under wall 34 and over sheet 16 would produce a venturi effect, resulting in sheet 16 being lifted and vibrated, with the possible dislocation of devices 38. The air stream 28a passing to the left does not cause a venturi effect because wall 32 is thin and air stream 28a comes into the open almost immediately upon exiting passageway 30.

It will be appreciated that, although the invention has been described for use in cleaving laser bars into individual devices. It is equally applicable to cleaving wafer sections into laser bars, or any other similar operation.

Although preferred embodiments of the invention have been disclosed for illustrative purposes, those skilled in the art will appreciate that many additions, modifications and substitutions are possible, without departing from the scope and spirit of the invention as defined by the accompanying claims.

What is claimed is:

1. A method for cleaving a semiconductor structure into subsections, the structure being provided with scribe marks defining a dimension of the subsections, said method comprising the steps of:

transporting a plurality of the structures between elongated, opposed upper and lower sheets of flexible material in a direction generally perpendicular to the scribe marks, the structures being aligned along the length of the sheets with their scribe marks extending laterally of the sheets, the sheets being supported on a stabilizing surface to prevent their vibration;

passing a leading edge of the structure over a raised, stationary breaker assembly, one of said sheets being in contact with the stabilizing surface beyond the breaker assembly in the direction of transportation;

directing an air stream at said leading edge from above, whereby a subsection defined by the leading edge and one of the scribe marks is separated from the structure along said one scribe mark.

2. The method of claim 1, further comprising, before said transporting step, providing a sheet of thin, cling-free sheet material in contact with one of the sheets of flexible material to prevent adhesion of the structure and subsections thereto.

3. The method of claim 1, further comprising placing an air curtain above the upper sheet at a point beyond the breaker assembly in the direction of transportation, the curtain extending closely to the upper sheet without touching the same.

4. The method of claim 3 wherein said air curtain is a section of the hook component of a hook-and-pile fastener.

5. The method of claim 1, wherein the supporting surface is stationary and the breaker assembly is mounted thereon.

6. The method of claim 1, wherein the breaker assembly is moved with the sheets.

7. An apparatus for cleaving a semiconductor structure into subsections, the structure being provided with scribe marks defining a dimension of the subsections, comprising:

upper and lower sheets of flexible material having a length and a width, the semiconductor structure being enclosed between the sheets with the scribe marks oriented width-wise of the sheets, the sheets being transported lengthwise along a path generally perpendicular to the scribe marks;

a stationary breaker assembly disposed below the sheets and extending upwardly into said path, whereby said sheets and the enclosed semiconductor structure must rise up on said breaker assembly when traversing said path;

a stabilizing surface disposed below said sheets to prevent vibration thereof, said lower sheet being in contact with said stabilizing surface at a point beyond said breaker assembly in the direction of transportation of said sheets; and a source of an air stream disposed above said sheets substantially in alignment with said breaker assembly and constructed to direct its air stream at said sheets, said air stream exerting a downward force against a leading edge of the semiconductor structure, whereby a subsection is cleaved therefrom at a nearby scribe mark.

8. The apparatus of claim 7, further comprising a sheet of thin, cling-free sheet material in contact with one of the sheets of flexible material to prevent adhesion of the section and bars thereto.

9. The apparatus of claim 7, further comprising an air curtain disposed above the upper sheet at a point beyond the breaker assembly in the direction of transportation, the curtain extending closely to the upper sheet without touching the same so as to prevent air flow along the upper surface of said upper sheet.

10. The apparatus of claim 9, wherein said air curtain is a section of the hook component of a hook-and-pile fastener.

11. The apparatus of claim 7, wherein said supporting surface is stationary and said breaker assembly is supported thereon.

12. The apparatus of claim 7, wherein said supporting surface is mounted to be moveable with said sheets of flexible material.

13. The apparatus of claim 7, wherein said breaker assembly comprises a bar of solid material disposed crosswise to the movement of said sheets in said path.

* * * * *